(12) United States Patent
Jeong

(10) Patent No.: US 12,279,512 B2
(45) Date of Patent: Apr. 15, 2025

(54) EXTENDIBLE DEPOSITION MASK AND DISPLAY APPARATUS PROVIDED USING THE SAME

(71) Applicant: Samsung Display Co., Ltd., Yongin-si (KR)

(72) Inventor: Dongseob Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 278 days.

(21) Appl. No.: 17/215,055

(22) Filed: Mar. 29, 2021

(65) Prior Publication Data
US 2021/0217957 A1    Jul. 15, 2021

Related U.S. Application Data

(63) Continuation of application No. 15/671,250, filed on Aug. 8, 2017, now Pat. No. 10,964,889.

(30) Foreign Application Priority Data

Sep. 22, 2016    (KR) .......................... 10-2016-0121518

(51) Int. Cl.
*C23C 14/04*   (2006.01)
*B05C 21/00*   (2006.01)
(Continued)

(52) U.S. Cl.
CPC ......... *H10K 71/166* (2023.02); *B05C 21/005* (2013.01); *C23C 14/042* (2013.01);
(Continued)

(58) Field of Classification Search
CPC ... C23C 14/042; C23C 16/04; G03F 7/70783; G03F 7/70758; G03F 7/70733; Y10T 29/53961; F16M 13/00
See application file for complete search history.

(56) References Cited

U.S. PATENT DOCUMENTS 5,534,969 A * 7/1996 Miyake .................. G03F 7/707
355/75
5,682,228 A * 10/1997 Miyake .................. G03F 7/707
355/75
(Continued)

FOREIGN PATENT DOCUMENTS

CN    103820753 A    5/2014
CN    103855325 A    6/2014
(Continued)

*Primary Examiner* — Karl Kurple
(74) *Attorney, Agent, or Firm* — CANTOR COLBURN LLP

(57) ABSTRACT

A deposition mask includes a first area defining a clamping portion at ends of the deposition mask and to which a force is applied to extend the deposition mask in a length direction thereof, a recess area adjacent to the first area and defining a recess at the ends; and a pattern portion including a plurality of pattern holes through which a deposition material passes. Along the length direction, a plurality of first pattern portions are arranged in the first area and a plurality of second pattern portions arranged in the recess area. When the force is applied to the clamping portion, the deposition mask is extended in the length direction thereof and defines non-extended positions of the pattern portions, and for the non-extended positions of the first and second pattern portions, a first distance between adjacent first pattern portions is less than a second distance between adjacent second pattern portions.

5 Claims, 8 Drawing Sheets

(51) Int. Cl.
*C23C 16/04* (2006.01)
*H01L 21/3213* (2006.01)
*H01L 21/67* (2006.01)
*H10K 71/00* (2023.01)
*H10K 71/16* (2023.01)
*H10K 71/20* (2023.01)

(52) U.S. Cl.
CPC ...... *C23C 16/042* (2013.01); *H01L 21/32139* (2013.01); *H01L 21/67* (2013.01); *H10K 71/00* (2023.02); *H10K 71/20* (2023.02)

(56) References Cited

U.S. PATENT DOCUMENTS

| | | | | |
|---|---|---|---|---|
| 6,943,066 | B2 * | 9/2005 | Brody | H01L 27/1214 |
| | | | | 438/149 |
| 7,214,554 | B2 * | 5/2007 | Winters | H10K 71/16 |
| | | | | 438/149 |
| 7,763,114 | B2 * | 7/2010 | Tokie | C23C 16/545 |
| | | | | 118/301 |
| 8,906,445 | B2 | 12/2014 | Kim et al. | |
| 9,187,817 | B2 | 11/2015 | Kim | |
| 9,346,078 | B2 | 5/2016 | Oh et al. | |
| 9,657,392 | B2 * | 5/2017 | Han | C23C 14/042 |
| 9,761,802 | B2 * | 9/2017 | Kuriyama | H10K 71/00 |
| 9,802,276 | B2 * | 10/2017 | Kim | B23K 37/0435 |
| 10,053,766 | B2 | 8/2018 | Kim | |
| 2003/0201711 | A1 * | 10/2003 | Abiko | H10K 71/166 |
| | | | | 313/504 |
| 2004/0135498 | A1 * | 7/2004 | Takanosu | H10K 59/35 |
| | | | | 313/506 |
| 2007/0137568 | A1 * | 6/2007 | Schreiber | C23C 14/562 |
| | | | | 118/726 |
| 2008/0000420 | A1 | 1/2008 | Kim | C23C 14/042 |
| | | | | 118/504 |
| 2009/0311427 | A1 * | 12/2009 | Marcanio | H05K 3/1225 |
| | | | | 29/829 |
| 2010/0192856 | A1 | 8/2010 | Sung et al. | |
| 2011/0031486 | A1 * | 2/2011 | Shigemura | H10K 71/00 |
| | | | | 257/E51.019 |
| 2011/0185966 | A1 * | 8/2011 | Lee | C23C 14/042 |
| | | | | 118/504 |
| 2012/0156812 | A1 * | 6/2012 | Ko | C23C 14/042 |
| | | | | 29/446 |
| 2012/0279444 | A1 | 11/2012 | Hong | C23C 14/042 |
| | | | | 118/504 |
| 2013/0174780 | A1 * | 7/2013 | You | H10K 71/00 |
| | | | | 118/504 |
| 2014/0065355 | A1 * | 3/2014 | Kang | C23C 14/042 |
| | | | | 428/137 |
| 2014/0158044 | A1 * | 6/2014 | Han | C23C 16/042 |
| | | | | 118/504 |
| 2015/0050767 | A1 * | 2/2015 | Kuriyama | H10K 71/00 |
| | | | | 438/34 |
| 2016/0144393 | A1 * | 5/2016 | Kwon | C23C 14/042 |
| | | | | 118/504 |
| 2016/0276421 | A1 * | 9/2016 | Lee | H10K 50/865 |
| 2021/0214837 | A1 * | 7/2021 | Ikenaga | H10K 50/865 |

FOREIGN PATENT DOCUMENTS

| | | |
|---|---|---|
| CN | 204434720 U | 7/2015 |
| CN | 104846328 A | 8/2015 |
| CN | 108690950 A | 10/2018 |
| EP | 2738284 A1 | 6/2014 |
| KR | 1020080002051 A | 1/2008 |
| KR | 1020100035918 A | 4/2010 |
| KR | 1020120125035 A | 11/2012 |
| KR | 20160054114 A | 5/2016 |

* cited by examiner

EXTENDIBLE DEPOSITION MASK AND DISPLAY APPARATUS PROVIDED USING THE SAME

This application is a continuation application of U.S. application Ser. No. 15/671,250 filed Aug. 8, 2017 and issued as U.S. Pat. No. 10,964,889 on Mar. 30, 2021, which claims priority to Korean Patent Application No. 10-2016-0121518, filed on Sep. 22, 2016, and all the benefits accruing therefrom under 35 U.S.C. § 119, the content of which in its entirety is herein incorporated by reference.

BACKGROUND

1. Field

One or more embodiments relate to a deposition mask, a deposition apparatus using the deposition mask and method of manufacturing a display apparatus using the deposition apparatus.

2. Description of the Related Art

Electronic devices based on mobility thereof have been widely used. As portable electronic devices, tablet personal computers ("PC"s), as well as relatively small electronic devices such as mobile phones, are being used widely.

Such portable electronic devices include a display apparatus for supporting various functions and for providing a user with visual information such as images or videos. As components for driving the portable display apparatus have been reduced in size, the importance of the portable display apparatus in an overall electronic device is gradually increasing. For a portable electronic device and the display apparatus, a structure capable of being bent by a predetermined angle from a flat state has been developed.

An organic material within a structure of the display apparatus or metal used as an electrode within the display apparatus may be deposited on a substrate of the display apparatus under a vacuum atmosphere to form a relatively thin film by a vacuum deposition method. The vacuum deposition method is executed by positioning a (target) substrate on which an organic thin film is to be formed, in a vacuum chamber, attaching to the positioned substrate a deposition mask having a deposition pattern corresponding to a pattern of the organic thin film to be formed, and vaporizing or subliming organic material by using a deposition source so that the organic material may be deposited on the substrate to form the organic thin film thereon.

SUMMARY

One or more embodiments include a deposition mask, and an apparatus and method of manufacturing a display apparatus.

Additional features will be set forth in part in the description which follows and, in part, will be apparent from the description, or may be learned by practice of the presented embodiments.

According to one or more embodiments, a deposition mask includes: a first area thereof elongated in a length direction of the deposition mask to define a clamping portion which is at opposite ends of the deposition mask in the length direction and to which a force is applied to extend the deposition mask in the length direction thereof, the first area being extended in the length direction by the force applied to the clamping portion; a recess area thereof disposed adjacent to the first area in a width direction of the deposition mask, the recess area elongated in the length direction of the deposition mask to define a recess which is at each of the opposite ends of the deposition mask, the recess area not being extended in the length direction by the force applied to the clamping portion; and a pattern portion including a plurality of deposition pattern holes through which a deposition material passes to a target on which the deposition material is deposited. The pattern portion is provided in plurality including: a plurality of first pattern portions arranged in the first area along the length direction, and a plurality of second pattern portions arranged in the recess area along the length direction. When the force is not applied to the clamping portion, the deposition mask includes non-extended positions of the plurality of pattern portions, and for the non-extended positions of the first and second pattern portions, and a first distance between adjacent first pattern portions is less than a second distance between adjacent second pattern portions.

Each of the pattern portions may be have a planar shape including one of a square shape, a circular shape and an oval shape.

Each of the pattern portions may have the square shape and include rounded corners.

The plurality of first pattern portions may define a plurality of first distances respectively between adjacent first pattern portions and the plurality of second pattern portions may define a plurality of second distances respectively between adjacent second pattern portions.

The first distances and the second distances may be respectively constant.

The second distances may gradually increase from a center portion of the deposition mask towards the opposite ends of the deposition mask.

According to one or more embodiments, a deposition apparatus for depositing a thin film includes: a mask frame assembly disposed to face a substrate on which the thin film is deposited and through which a deposition material passes to the substrate; and a deposition source disposed to face the mask frame assembly and from which the deposition material is injectable towards the mask frame assembly. The mask frame assembly includes: a deposition mask through which the deposition material passes to the substrate and which is extendable in a length direction thereof, and a frame to which the deposition mask extended in the length direction thereof is bonded, the frame including an opening in a center portion thereof. The deposition mask includes: a first area thereof elongated in the length direction to define a clamping portion which is at opposite ends of the deposition mask in the length direction and to which a force is applied to extend the deposition mask in the length direction thereof, the first area being extended in the length direction by the force applied to the clamping portion; a recess area thereof disposed adjacent to the first area, the recess area elongated in the length direction of the deposition mask to define a recess which is at each of the opposite ends of the deposition mask, the recess area not being extended in the length direction by the force applied to the clamping portion; and a pattern portion including a plurality of deposition pattern holes through which the deposition material passes. The pattern portion is provided in plurality including: a plurality of first pattern portions arranged in the first area along the length direction, and a plurality of second pattern portions arranged in the recess area along the length direction. When the force is not applied to the clamping portion, the deposition mask includes non-extended positions of the plurality of pattern portions, and for the non-extended positions of the first and second pattern portions, and a first distance between adjacent first pattern portions is less than a second distance between adjacent second pattern portions.

Each of the pattern portions may have a planar shape including one of a square shape, a circular shape and an oval shape.

Each of the pattern portions may have the square shape and include rounded corners.

The plurality of first pattern portions may define a plurality of first distances respectively between adjacent first pattern portions and the plurality of second pattern portions may define a plurality of second distances respectively between adjacent second pattern portions.

The first distances and the second distances may be respectively constant.

The second distances may gradually increase from a center portion of the deposition mask towards the opposite ends of the deposition mask.

The deposition mask bonded to the frame may exclude the clamping portion.

The force applied to the clamping portion defines extended positions of the plurality of pattern portions and for the extended positions of the plurality of the pattern portions, the first distance is equal to the second distance.

According to one or more embodiments, a method of manufacturing a thin film of a display apparatus includes: preparing a mask frame assembly including a deposition mask which is stretched in a length direction thereof and a frame to which the stretched deposition mask is bonded; disposing the mask frame assembly and a substrate on which the thin film is deposited adjacent to and facing each other in a deposition chamber; and depositing a deposition material from a deposition source through the mask frame assembly and onto the substrate to form the thin film. The preparing the mask frame assembly includes: preparing the deposition mask including: a first area thereof elongated in the length direction to define a clamping portion which is at opposite ends of the deposition mask in the length direction and to which a force is applied to stretch the deposition mask in the length direction thereof; a recess area thereof disposed adjacent to the first area, the recess area elongated in the length direction of the deposition mask to define a recess which is at each of the opposite ends of the deposition mask; and defining a pattern portion including a plurality of deposition pattern holes through which the deposition material passes, the pattern portion provided in plurality including a plurality of first pattern portions arranged in the first area along the length direction, and a plurality of second pattern portions arranged in the recess area along the length direction, where when the force is not applied to the clamping portion, the deposition mask includes non-extended positions of the plurality of pattern portions, and for the non-extended positions of the first and second pattern portions, a first distance between adjacent first pattern portions is less than a second distance between adjacent second pattern portions; stretching the deposition mask in the length direction thereof by applying the force to the clamping portion at the opposite ends of the deposition mask, the stretching of the deposition mask: extends the first area and defines an extended first distance between the adjacent first pattern portions which is greater than the first distance, and does not extend the recess area of the deposition mask; and attaching the stretched deposition mask to the frame which includes an opening in a center portion thereof.

Each of the pattern portions may have a planar shape including one of a square shape, a circular shape and an oval shape.

Each of the pattern portions may have the square shape and include rounded corners.

The plurality of first pattern portions may define a plurality of first distances respectively between adjacent first pattern portions and the plurality of second pattern portions may define a plurality of second distances respectively between adjacent second pattern portions.

The first distances and the second distances may be respectively constant.

The second distances may gradually increase from a center portion of the deposition mask towards opposite ends of the deposition mask.

The attaching the stretched deposition mask to the frame may include removing the clamping portion.

The stretching of the deposition mask may define extended positions of the plurality of pattern portions, and for the extended positions of the plurality of the pattern portions, the first distance may correspond to the second distance.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
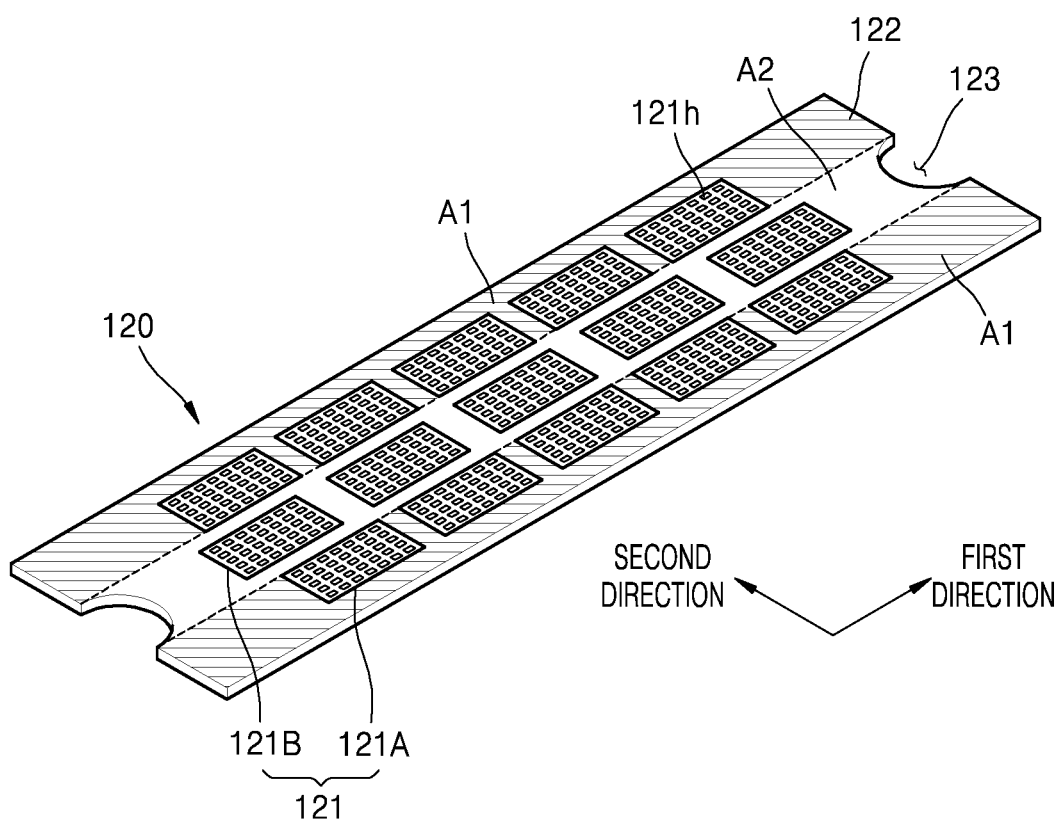
FIG. 1 is a perspective view of an embodiment of a deposition mask according to the invention.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

In describing relationships between elements such as being "on," "connected to," "between," etc., it will be understood that an element can be directly related to another element or intervening elements may be present therebetween. In contrast, when an element is referred to as being "directly" related to another element, there are no intervening elements present.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments are not limited thereto.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

The exemplary embodiments will be described below in more detail with reference to the accompanying drawings. Those components that are the same or are in correspondence are rendered the same reference numeral regardless of the figure number, and redundant explanations are omitted. As used herein, the term "and/or" includes any and all combinations of one or more of the associated listed items. Expressions such as "at least one of," when preceding a list of elements, modify the entire list of elements and do not modify the individual elements of the list.

In addition, a display apparatus according to one or more embodiments of the present disclosure may include various types of display apparatuses. For example, the display apparatus may include a liquid crystal display apparatus or an organic light-emitting display apparatus. Hereinafter, a case where the display apparatus is an organic light-emitting display apparatus will be described for convenience of description.

A display apparatus having a relatively large size has been requested by market demand. Accordingly, a deposition mask is manufactured to be larger than that of the related art such as used in forming a relatively small display apparatus. In addition, in forming a thin film on a substrate to implement relatively high resolution of the display apparatus, reducing a shadow effect is desired. To do this, a position of a deposition mask is maintained relative to a target substrate to reduce or prevent a gap therebetween during a deposition process and the deposition mask is configured to have a relatively small (minimal) cross-sectional thickness.

In general, in order to obtain a structure in which no gap or minimal is generated between a deposition mask and a target substrate, the deposition mask and the substrate are adhered to each other, and the deposition mask is arranged on a deposition apparatus frame in a tensed state due to a tensile force applied to opposite ends of the deposition mask.

Figure 2:
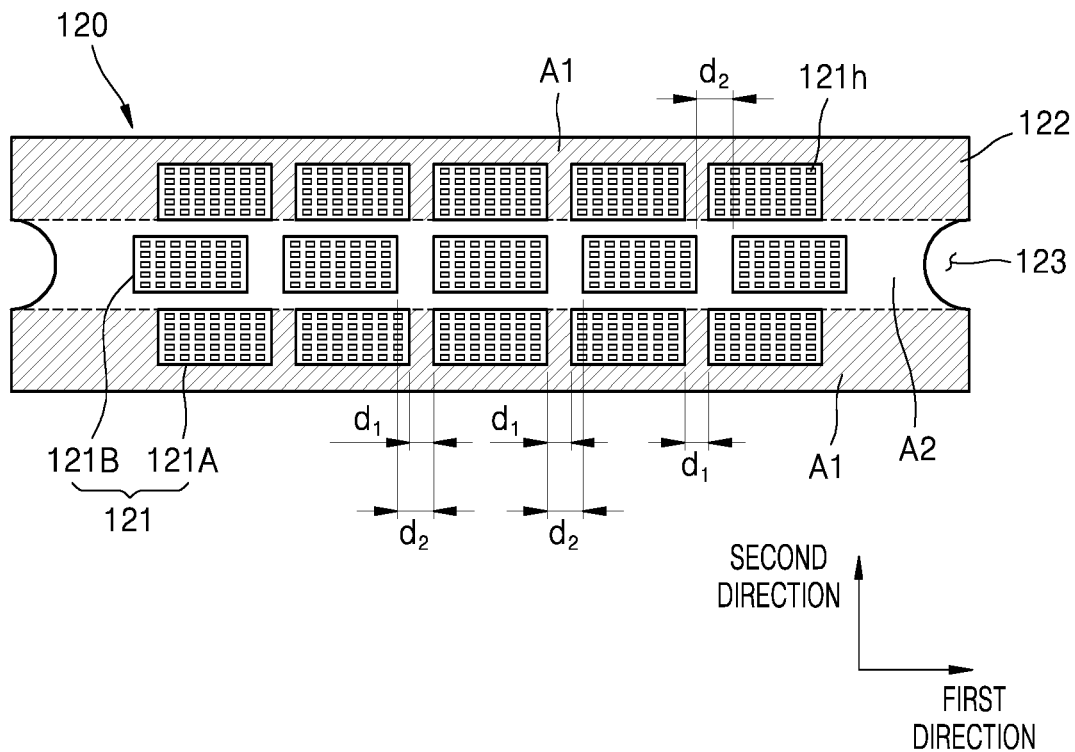
FIG. 2 is a top plan view of the deposition mask of FIG. 1 in a non-tensile state thereof.
Figure 3:
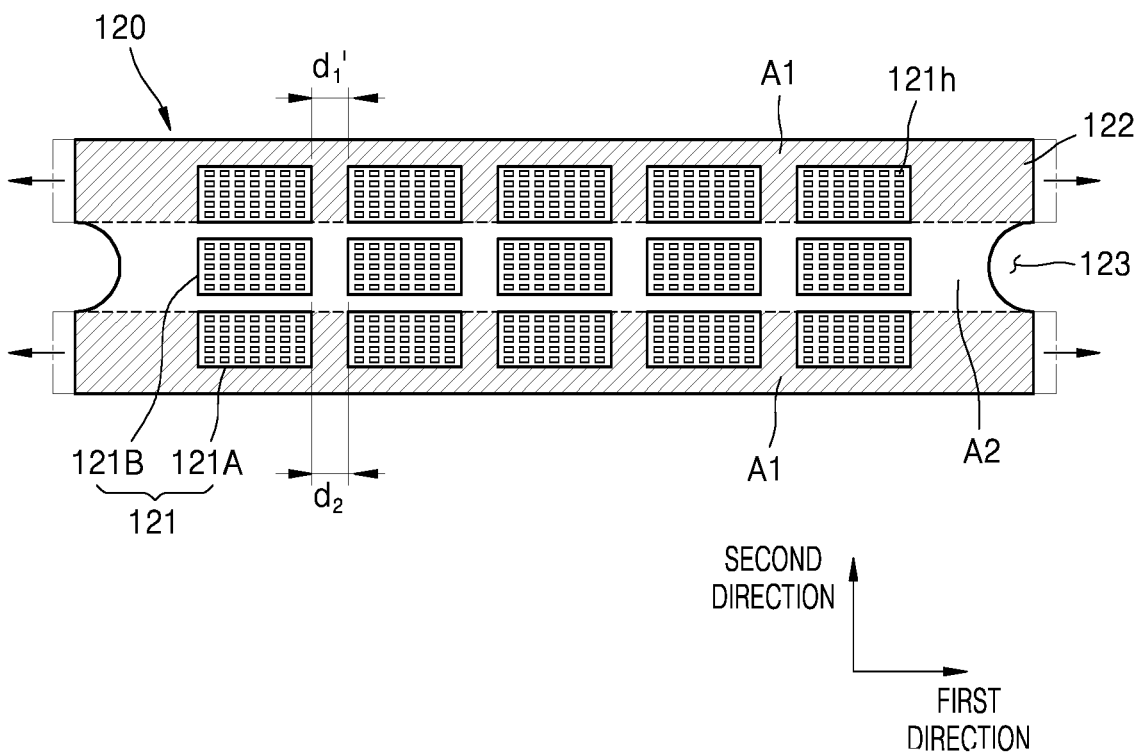
FIG. 3 is a top plan view of the deposition mask of FIG. 2 in a tensile state thereof.

FIG. 1 is a perspective view of an embodiment of a deposition mask 120 according to the invention, FIG. 2 is a top plan view of the deposition mask 120 of FIG. 1 in a non-tensile state, and FIG. 3 is a top plan view showing a tensile state of the deposition mask 120 of FIG. 2.

Referring to FIGS. 1 and 2, the deposition mask 120 according to the invention may include or define a pattern portion 121, a clamping portion 122, and a clamping recess 123. One or more of these features of the deposition mask 120 may be provided in plurality within a single deposition mask 120.

The pattern portion 121 may include a (deposition) pattern hole 121h provided in plurality at a region of the deposition mask 120 and through which a deposition material passes to a target such as a substrate. The region of the deposition mask 120 at which the pattern holes 121h are disposed may be considered a mesh region of the deposition mask 120. Regions of the deposition mask 120 between and adjacent to the patterns portions 121 may respectively be solid regions of the deposition mask 120 in which no pattern hole 121h is disposed.

The plurality of pattern holes 121h may have the same planar shapes as one another (e.g., in the top plan view) to have corresponding planar areas. FIGS. 1 and 2 illustrate the pattern holes 121h as rectangular planar shapes, but one or more embodiments are not limited thereto. That is, each of the pattern holes 121h may have various planar shapes, e.g., a polygonal shape, a circular shape and an oval shape. Hereinafter, a case where the pattern holes 121h are rectangular in planar shape will be described for convenience of description.

Next, the clamping portion 122 is provided in plurality respectively at opposite ends of the deposition mask 120 in a length direction thereof. The clamping portion 122 may extend a length distance in a first direction from an end of the deposition mask 120. For a deposition method to form a relatively thin film on a target, the clamping portion 122 may be held or clamped in a tensile state of the deposition mask 120 such as by a clamp (not shown).

Among a total planar area of the end of the deposition mask 120, the clamping recess 123 is a remaining area except the clamping portion 122 at the opposite ends of the deposition mask 120, and is not extended in a tensile state of the deposition mask 120 such as when the clamping portion 120 is held by the clamp described above. From a second direction (end) edge of the deposition mask 120, the clamping recess 123 may be formed to be recessed at a length distance toward the pattern portion 121 from the second direction edge of the deposition mask 120 and define a length distance of the clamping portion 122. In general, an inner circumferential surface of the deposition mask 120 at the clamping recess 123 may be formed as a curved surface in order to reduce or effectively prevent the deformation or damage to the deposition mask 120 due to the tensile force applied thereto. However, the shape of the inner surface at the clamping recess 123 is not limited thereto, that is, may be formed to have one or more inflection points at which the inner surface is bent in the top plan view.

Hereinafter, the clamping recess 123 and the clamping portion 122 of the deposition mask 120 will be described in more detail below.

The deposition mask 120 is used during a process of depositing a deposition material such as an organic material or metal material on an effective area or region set in advance on a substrate (S of FIG. 4A) which may form a part of a display apparatus (not shown). The deposition mask 120 may be fixed to a frame (110 of FIGS. 4A and 4B), such as by welding, in a state where opposite ends of the deposition mask 120 are respectively clamped to the frame such as by a clamp in order to reduce or effectively prevent generation of a shadow effect.

Here, the "shadow effect" denotes a defect generated when the deposition material is deposited on another area than the effective region set in advance on the substrate S where the deposition material is to be deposited. Such defect may be generated when positions of the substrate S and the deposition mask 120 are not maintained relative close to each other and/or when the substrate S and the deposition mask 120 are not attached to each other and a gap is undesirably generated therebetween. Therefore, in order to reduce or effectively prevent generation of the shadow effect, a position of the deposition mask 120 is maintained close to such as adhered to the substrate S in a state where the deposition mask 120 is extended or stretched as much as possible so as not to generate a gap between the deposition mask 120 and the substrate S.

To do this, the clamping portion 122 of the deposition mask 120 is clamped to the frame such as by a clamp before the deposition mask 120 is more firmly attached to the frame 110 such as being welded to the frame 110. Then, the deposition mask 120 is tightly pulled by the clamp such as by applying a tensile force to the deposition mask 120 in a first direction (e.g., length direction thereof) in a state where the clamping portion 122 is clamped. After that, the frame 110 and the deposition mask 120 which is under the tensile force are welded to each other in a state where the opposite ends of the deposition mask 120 in the length direction thereof are mounted on the frame 110. In an embodiment, for example, the frame 110 and the deposition mask 120 may be bonded to each other via a welding portion 115 at an interface therebetween (see FIG. 4B).

After the welding process between the frame 110 and the deposition mask 120 is performed, some parts of the opposite ends of the deposition mask 120 are removed as excess portions thereof which extend further than the frame 110. In an embodiment, for example, an entire of the clamping portion 122 shown in FIGS. 1 and 2 may be removed as a portion of the stretched deposition mask 120 which extends beyond the frame 110. That is, the deposition mask which has been extended in the length direction by the tensile force and bonded to the frame 110 excludes the clamping portion 122 which has been extended in the length direction by the tensile force applied thereto. As a result of the above processes, a gap between the deposition mask 120 and the substrate S may be reduced, and accordingly, generation of the shadow effect may be effectively prevented.

Referring back to FIGS. 1 and 2, a plurality of pattern portions 121 may be arranged in a first direction (e.g., length direction of the deposition mask 120) and a second direction which crosses the first direction (e.g., a width direction of the deposition mask 120). A thickness of the deposition mask 120 may extend in a third direction which crosses both the first and second directions, such as being perpendicular thereto. The cross-sectional view of FIGS. 4A and 4B corresponds to the thickness direction of the deposition mask 120.

Although FIGS. 1 and 2 show that five pattern portions 121 of rectangular shapes are arranged in the first direction and three pattern portions 121 of rectangular shapes are arranged in the second direction, one or more embodiments are not limited thereto. Various modified examples of the pattern portions 121 will be described later with reference to FIGS. 6 to 10. Here, for convenience of description, the example in which the pattern portion 121 has a rectangular planar shape and there are five pattern portions 121 in the first direction and three pattern portions 121 in the second direction will be described in detail.

The pattern portions 121 may include a plurality of first pattern portions 121A overlapping (e.g., disposed in a line) with the clamping portion 122 in the first direction, and a plurality of second pattern portions 121B overlapping with the clamping recess 123 in the first direction. A solid portion of the deposition mask 120 surrounds each of the pattern portions 121. Here, it is assumed that the first pattern portions 121A are arranged in a first area A1 of the deposition mask 120 extended by the clamping and stretching process and the second pattern portions 121B are arranged in a second area A2 of the deposition mask 120, to which the tensile force is affected indirectly, not applied directly or not applied at all. The first area A1 of the deposition mask 120 may be considered as defining the clamping portion 120 at opposing ends thereof. The second area A2 of the deposition mask 120 may be considered as defining the recess 123.

The second area A2 is disposed between two first areas A1 in a width direction of the deposition mask 120. The first and second areas A1 and A2 may alternate with each other in the width direction of the deposition mask 120. As indicated by the shading in FIGS. 1 and 2, each first area A1 may be defined extended inward for a width distance from a first direction edge of the deposition mask 120 to include an entire length portion in the first (length) direction of the deposition mask 120 over such width distance. As indicated by the un-shaded portion in FIGS. 1 and 2, the second area A2 may be defined extended for a width distance between the first areas A1 to include an entire length portion in the first (length) direction of the deposition mask 120 between the first areas A1.

Referring to FIG. 2, in an initial (non-tensile) state of the deposition mask 120, a first distance d1 between two adjacent first pattern portions 121A spaced apart in the first direction may be less than a first-second distance d2 between two adjacent second pattern portions 121B spaced apart in the first direction. The distances d1 and d2 are taken an outer boundary of the respective pattern portion, such as where the mesh portion of the deposition mask meets the solid portion, i.e., at an interface between the pattern portion and the solid portion adjacent thereto. The first distances d1 within the first area A1 may be constant or equal to each other, and the second distances d2 within the second area A2 may be constant or equal to each other, but the invention is not limited thereto. As shown in FIG. 2, the pattern portions 121 are staggered in the second direction.

When the deposition mask 120 having the above structure is extended (see FIG. 3) by the clamp and bonded to the frame 110, staggering of the pattern portions 121 in the second direction due to the tensile force may be reduced or effectively prevented. That is, initial positions of the first pattern portions 121A relative to each other and to the second pattern portions 121B are defined such that extended positions of the first pattern portions 121A align with initial positions of the second pattern portions 121B. Initial positions of the first pattern portions 121A in the second area A2 may be substantially maintained even when the deposition mask 120 is extended at the first area A1.

Relative positions of the pattern portions 121 will be described in more detail below with reference to FIGS. 2 and 3. When a force is not applied to the clamping portion 122, such as before applying the tensile force (see FIG. 2), the distance between the first pattern portions 121A arranged in the first area A1 is equal to the first distance d1. However, when the force is applied to the clamping portion 122, such as when the clamp applies the tensile force to the opposite ends of the clamping portion 122 in a tensile direction along a length of the deposition mask 120 (see arrows of FIG. 3 indicated at each clamping portion 122), the distance between the first pattern portions 121A increases to be greater than the first distance d1 (e.g., d1'). However, the initial first-second distance d2 between the second pattern portions 121B arranged in the second area A2 is minimally (if at all) affected by the tensile force applied to the first area A1, and thus, the first-second distance d2 between the second pattern portions 121B may be effectively maintained. Also, the first-second distance d2 between the second pattern portions 121B may substantially correspond to the increased first distance d1' between the first pattern portions 121A at extended positions thereof (d1'=d2).

Figure 4A:
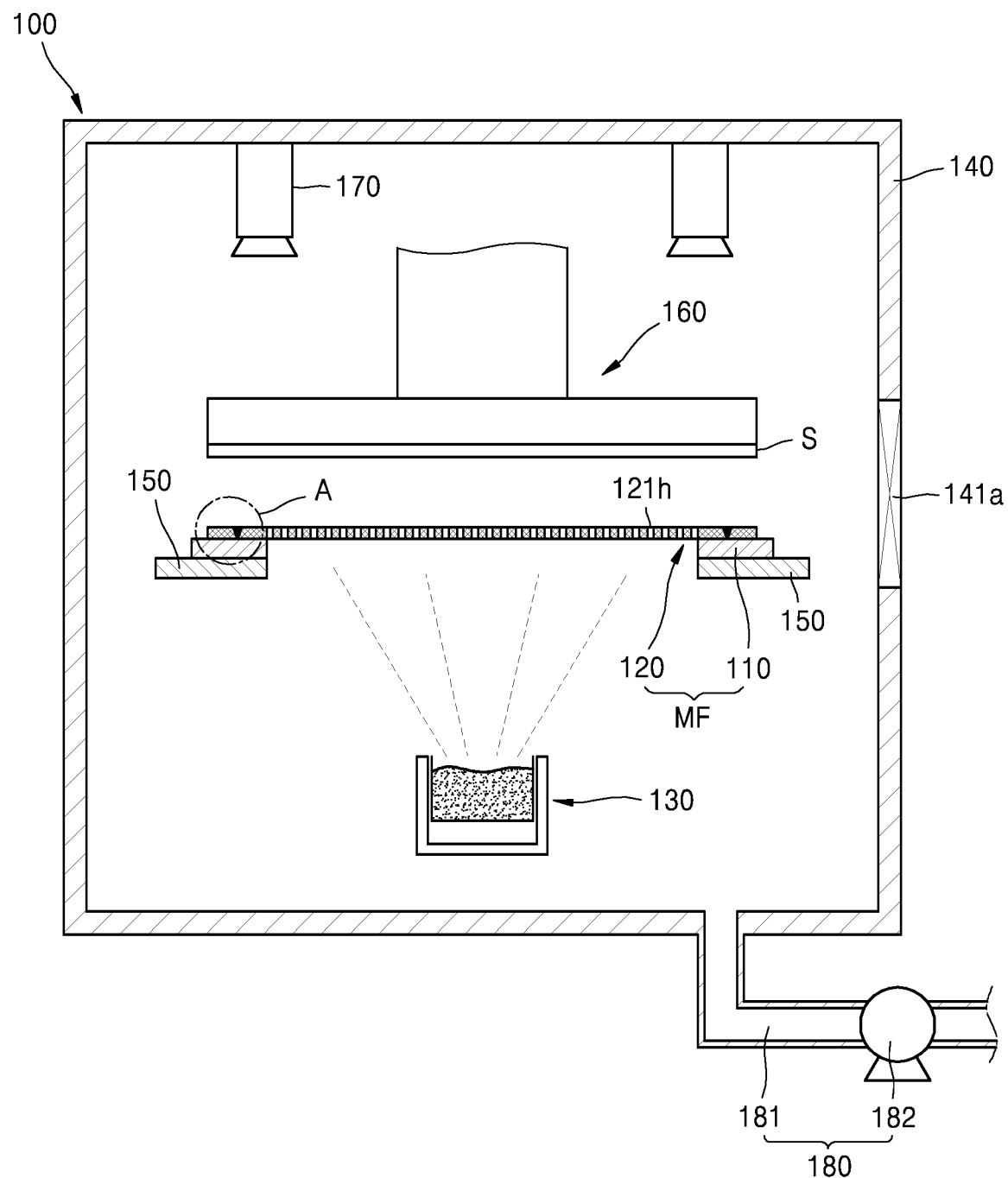
FIG. 4A is a cross-sectional view of an embodiment of a deposition apparatus in which the deposition mask of FIG. 1 is used for thin film deposition.
Figure 4B:
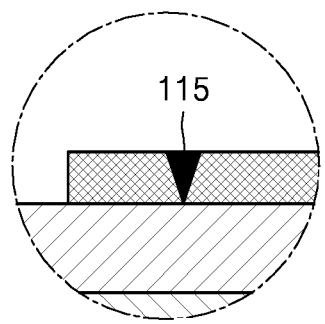
FIG. 4B is a cross-sectional view of an embodiment of an end portion of the deposition mask in FIG. 4A.

FIG. 4A is a cross-sectional view of an embodiment of a deposition apparatus in which the deposition mask of FIG. 1 is used for thin film deposition, and FIG. 4B is a cross-sectional view of an embodiment of an end of the deposition mask in FIG. 4A.

The deposition apparatus 100 may define a system for forming a thin film. The deposition apparatus 100 may include a mask frame assembly MF, a deposition source 130, a chamber 140, a supporter 150, a fixing member such as an electrostatic chuck 160, a vision portion 170 and a pressure adjuster 180.

The mask frame assembly MF in the chamber 140 may be disposed to face the substrate S in the chamber 140. The mask frame assembly MF may include the frame 110 having an opening in a center portion thereof which is overlapped by one or more embodiment of a deposition mask 120, and the deposition mask 120 extended in the first (length) direction thereof to be disposed in a state where opposite ends thereof are clamped by a clamp to be mounted on the frame 110. The deposition mask 120 of FIG. 4 is in a state where an initial state of the deposition mask 120 as illustrated in FIG. 2 is extended in the first direction to be disposed in an extended state as shown in FIG. 3 and then opposite ends of the extended-state deposition mask 120 are mounted on the frame 110 via the welding portions 115. As described above, after mounting the extended deposition mask 120 on the frame 110, the extended clamping portion 122 protruding from the opposite ends of the deposition mask 120 shown in FIGS. 1 to 3 may be removed. Where FIG. 3 shows the first area A1 extended by dotted lines, such dotted line portion may be removed. FIG. 4 illustrates ends of the deposition mask 120 not extending beyond edges of the frame 110 since the clamping portion 122 has been removed.

Here, the deposition mask 120 shown in FIG. 4 has structural characteristics that substantially correspond to those of the deposition mask 120 as illustrated with reference to FIGS. 1 to 3, additional descriptions about the deposition mask 120 are omitted here.

In addition, the deposition source 130 in the chamber 140 may face the mask frame assembly MF in the chamber 140 to inject a deposition material towards the mask frame assembly MF. Therefore, the deposition material may be accommodated in the deposition source 130, and the deposition source 130 may include a heater (not shown) for heating the deposition material. Here, the deposition material may be a material that may be sublimed or vaporized such as when heated. The deposition material may include at least one of an inorganic material, metal and an organic material. However, an example in which the deposition material is an organic material will be described below for convenience of description.

The chamber 140 may have a sealed space therein, and an opening in a part thereof. Here, a gate valve 141a may be provided in communication with the opening of the chamber 140 to close and open the opening.

The supporter 150 in the chamber 140 may support and fix the mask frame assembly MF within the chamber 140. In addition, the supporter 150 may be rotatable or linearly movable to correspondingly move the mask frame assembly MF to align the mask frame assembly MF with the substrate S.

The electrostatic chuck 160 in the chamber 140 may be arranged in the chamber 140 to face the substrate S. Here, the electrostatic chuck 160 may apply an attractive force to the deposition mask 120 to pull the mask frame assembly MF including the deposition mask 120 towards the substrate S. That is, the electrostatic chuck 160 may not only reduce or effectively prevent the deposition mask 120 from sagging, but also adhere the deposition mask 120 to the substrate S.

The vision portion 170 is arranged in communication with an inside of the chamber 140 so as to provide visual images such as photographing locations of the substrate S and the mask frame assembly MF within the chamber 140, relative to each other, etc. The vision portion 170 may include a camera for photographing the substrate S and the mask frame assembly MF. As such, locations of the substrate S and the mask frame assembly MF within the chamber 140 may be monitored based on images captured by the vision portion 170. Additionally, the supporter 150 may be moved to relatively finely adjust the location of the mask frame assembly MF based on location information of the substrate S and the mask frame assembly MF generated with the vision portion 170.

The pressure adjuster 180 may include a connecting pipe 181 connected to the chamber 140 and a pump 182 provided on the connecting pipe 181. Here, external air may be introduced through the connecting pipe 181 and/or gas in the chamber 140 may be discharged to outside the chamber 140 through the connecting pipe 181 according to operations of the pump 182.

In addition, the deposition apparatus 100 may be a system used in manufacturing a display apparatus 20 (see FIG. 5) that will be described later. In an embodiment of a method of depositing a thin film such as in manufacturing a display apparatus, when the pressure adjuster 180 adjusts an internal pressure of the chamber 140 to be equal or similar to atmospheric pressure, the gate valve 141a operates to open the opening of the chamber 140.

After that, the substrate S may be transferred into the chamber 140 from outside thereof through the open opening. Here, the substrate S may be carried into the chamber 140 in various ways. In an embodiment, for example, the substrate S may be carried into the chamber 140 by a robot arm disposed outside the chamber 140.

As another example, when the supporter 150 includes a shuttle portion, the supporter 150 is discharged from the chamber 140 to the outside the chamber 140 by the shuttle. After that, the substrate S may be mounted on the supporter 150 outside the chamber 140 by an additional robot arm provided outside the chamber 140. The supporter 150 may be carried into the chamber 140 from outside thereof while supporting the substrate S. However, an example in which the substrate S is carried into the chamber 140 from an external portion by the robot arm provided outside the chamber 140 will be described in detail for convenience of description.

The mask frame assembly MF may be arranged in the chamber 140 as described above. As another example, the mask frame assembly MF may be carried into the chamber 140 from outside thereof, similarly to the substrate S. However, an example in which the mask frame assembly MF is arranged in the chamber 140 and only the substrate S is carried into the chamber 140 from outside thereof will be described in detail, for convenience of description.

When the substrate S is carried into the chamber 140, the substrate S may be mounted on a support portion (not shown) having similar structure and functions as those of the supporter 150. Here, the vision portion 170 may photograph locations of the substrate S and the mask frame assembly MF in the chamber 140. In particular, the vision portion 170 may capture images of a first alignment mark (not shown) of the substrate S and a second alignment mark (not shown) of the mask frame assembly MF.

Based on the locations of the first alignment mark and the second alignment mark, locations of the substrate S and the mask frame assembly MF in the chamber 140 may be identified. Here, the deposition 100 apparatus includes an additional controller (not shown, disposed outside or within the deposition system) to monitor the locations of the substrate S and the mask frame assembly MF. When the locations of the substrate S and the mask frame assembly MF in the chamber 140 are identified, at least one of the support portion for supporting the substrate S and the supporter 150 for supporting the mask frame assembly MF may be controlled to adjust the location of the mask frame assembly MF including the deposition mask 120.

After that, with positions of the effective area of the substrate S and the pattern portion 121 of the mask frame assembly MF adjusted to an aligned position in the chamber 140, the deposition source 130 operates to spray the deposition material towards the mask frame assembly MF. The deposition material after passing through the plurality of pattern holes 121h in the deposition mask 120 of the mask frame assembly MF may be deposited on the substrate S at the desired effective area thereof. Here, for deposition of the deposition source 130 onto the substrate S, the pump 182 affects movement of the gas in the chamber 140 to discharge the gas to the outside thereof, and thus, the internal pressure of the chamber 140 may be maintained at the vacuum state or close to the vacuum state.

Hereinafter, an embodiment of the display apparatus 20 that is manufactured by the deposition apparatus 100 including the deposition mask 120 and a manufacturing method of the display apparatus will be described in detail.

Figure 5:
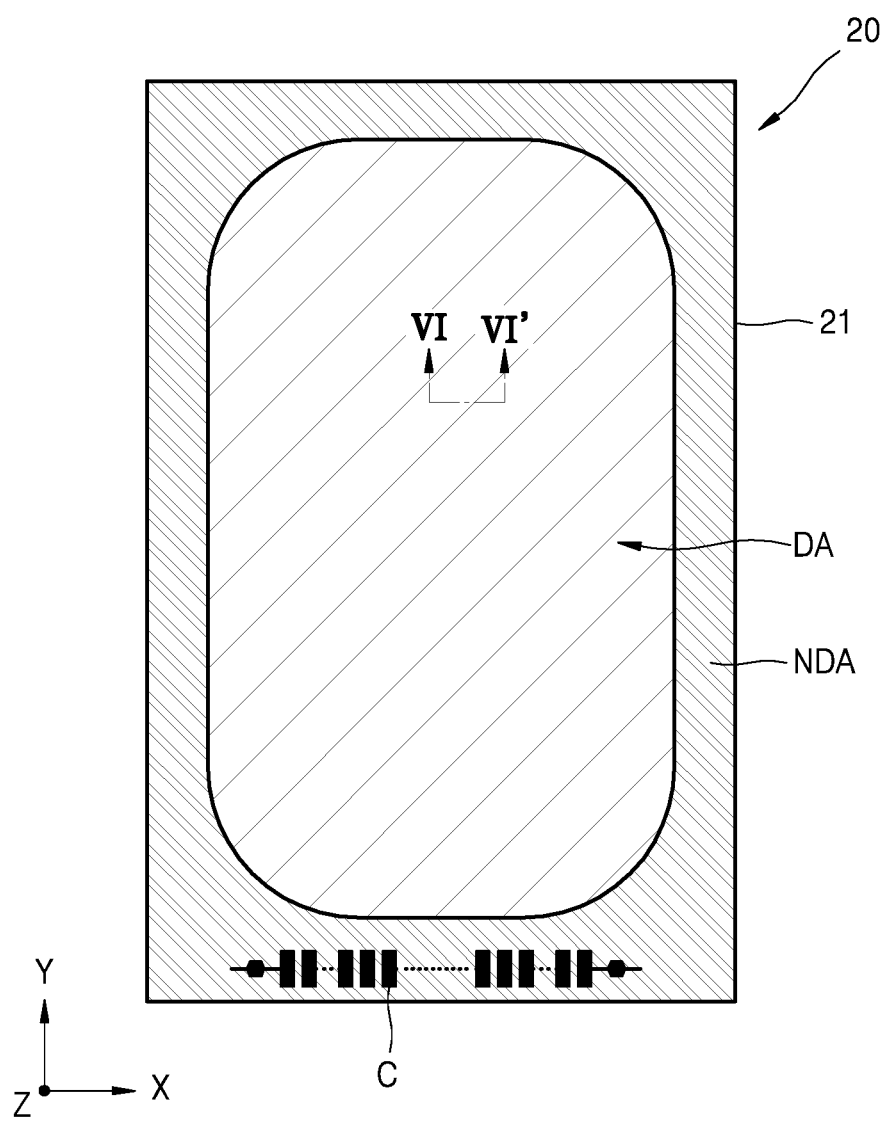
FIG. 5 is a top plan view of an embodiment of a display apparatus manufactured by the deposition apparatus of FIGS. 4A and 4B.
Figure 6:
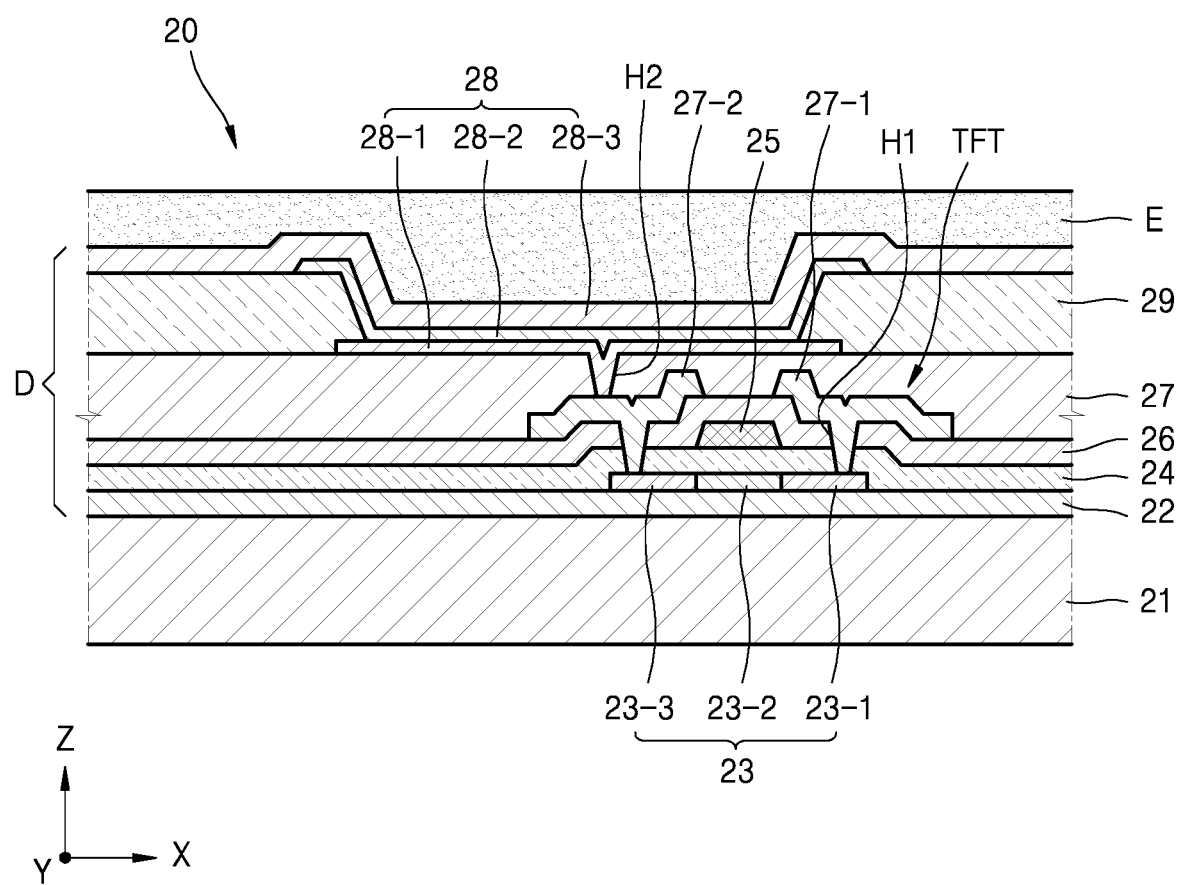
FIG. 6 is a cross-sectional view of the display apparatus of FIG. 5 taken along line VI-VI'.

FIG. 5 is a top plan view of an embodiment of the display apparatus 20 manufactured by the deposition apparatus 100 system of FIGS. 4A and 4B, and FIG. 6 is a cross-sectional view of the display apparatus 20 of FIG. 5 taken along line VI-VI'. The display apparatus 20 may include a pair of (long) sides extended in a Y-direction and a pair of (short) sides extended in an X-direction which crosses the Y-direction. A thickness of the display apparatus may extend in the Z-direction which crosses both the Y- and X-directions, such as being perpendicular thereto.

Referring to FIGS. 5 and 6, the display apparatus 20 may include a display area DA and a non-display area NDA which is outside the display area DA on a substrate 21. An image may be generated and displayed in the display area DA. The image may not be displayed in the non-display area NDA. An emission portion D of the display apparatus 20 may be arranged in the display area DA. Conductive lines (not shown) through which signals (e.g., control, driving, power, etc.) are transmitted to the display area DA may be arranged in the non-display area NDA and connected to elements of the display area DA such as the emission portion D. In addition, a pad portion C may be arranged in the non-display area NDA.

The display apparatus 20 may include the substrate 21 on which layers thereof are disposed. Among the layers of the display apparatus 20, the emission portion D is disposed in the display area of the substrate 21. In addition, the display apparatus 20 may include a thin film encapsulation layer E over the emission portion D. Here, the substrate 21 may include a glass material, but is not limited thereto. The substrate 21 may include a plastic material or a metal material such as steel use stainless ("SUS") and Ti. In addition, the substrate 21 may include polyimide ("PI"). Hereinafter, a case where the substrate 21 includes a glass material will be described in detail for convenience of description.

The emission portion D may be on the substrate 21. Here, the emission portion D may include a thin film transistor ("TFT"), a passivation layer 27 which covers the TFT, and an organic light-emitting device ("OLED") 28 on the passivation layer 27.

A buffer layer 22 is on an upper surface of the substrate 21. The buffer layer 22 may include an organic compound and/or an inorganic compound, and may include $SiO_x(x \geq 1)$ or $SiN_x(x \geq 1)$.

An active layer 23 of the TFT is arranged over the buffer layer 22 in a predetermined pattern. The active layer 23 is embedded at the TFT by a portion of a gate insulating layer 24. The active layer 23 includes or defines a source region 23-1 and a drain region 23-3, and a channel region 23-2 between the source and drain regions 23-1 and 23-3.

The active layer 23 may include various materials. In an embodiment, for example, the active layer 23 may include an inorganic semiconductor material such as amorphous silicon or crystalline silicon. As another example, the active layer 23 may include oxide semiconductor. As another example, the active layer 23 may include an organic semiconductor material. Hereinafter, an example in which the active layer 23 includes amorphous silicon will be described below in detail for convenience of description.

In an embodiment of a method of manufacturing the display apparatus 20, the active layer 23 may be obtained by arranging an amorphous silicon material layer on the buffer layer 22, crystallizing the amorphous silicon material layer into a polycrystalline silicon layer, and patterning the polycrystalline silicon layer. The source region 23-1 and drain region 23-3 of the active layer 23 are doped with impurities according to a kind of the TFT, e.g., a driving TFT or a switching TFT of the display apparatus 20.

A gate electrode 25 of the TFT corresponding to the active layer 23, and an interlayer insulating layer 26 which embeds the gate electrode 25 are arranged on an upper surface of the gate insulating layer 24.

In addition, a contact hole H1 is disposed or formed in the interlayer insulating layer 26 and the gate insulating layer 24. A source electrode 27-1 and a drain electrode 27-2 of the TFT are arranged on the interlayer insulating layer 26 so as to respectively contact the source region 23-1 and the drain region 23-3 of the active layer 23.

The passivation layer 27 is arranged over the TFT obtained as described above. A pixel electrode 28-1 of the OLED 28 is arranged on the passivation layer 27. The pixel electrode 28-1 contacts the drain electrode 27-2 of the TFT at a via hole H2 disposed or formed in the passivation layer 27. The passivation layer 27 may have a single-layered structure or a multi-layered structure including an inorganic material and/or an organic material. The passivation layer 27 may be a planarization layer having a flat upper surface regardless of profiles of underlayers or may be a curved (e.g., non-flat) layer having a non-linear upper surface according to the profiles of the underlayers. In addition, the passivation layer 27 may include a transparent insulator material so as to achieve a resonance effect.

After arranging the pixel electrode 28-1 over the passivation layer 27, a pixel-defining layer 29 covers the pixel electrode 28-1 and the passivation layer 27. The pixel-defining layer 29 includes an organic material and/or an inorganic material, and an opening is disposed or formed in the pixel-defining layer 29 and exposes the pixel electrode 28-1.

In addition, an intermediate layer 28-2 and an opposite electrode 28-3 of the OLED 28 are arranged over the pixel electrode 28-1.

The pixel electrode 28-1 functions as an anode electrode of the OLED 28 and the opposite electrode 28-3 functions as a cathode electrode of the OLED 28, or vice versa.

The pixel electrode 28-1 and the opposite electrode 28-3 are insulated from each other by the intermediate layer 28-2, and voltages of different polarities are applied to the intermediate layer 28-2 to emit light at the emission portion D.

The intermediate layer 28-2 may include an organic emission material layer. As another example, the intermediate layer 28-2 may include the organic emission layer, and may further include at least one of a hole injection layer ("HIL"), a hole transport layer ("HTL"), an electron transport layer ("ETL"), and an electron injection layer ("EIL"). However, the embodiment is not limited thereto, and the intermediate layer 28-2 may include the organic emission layer and may further include various other functional layers (not shown).

In addition, a unit pixel at which an image is displayed may be disposed in the display area DA of the display apparatus 20. One unit pixel may include a plurality of sub-pixels at which the image is displayed, and the plurality of sub-pixels may emit various light colors. In an embodiment, for example, the plurality of sub-pixels may include sub-pixels respectively emitting red light, green light and blue light, or sub-pixels (not denoted by reference numerals) respectively emitting red light, green light, blue light and white light. Each unit pixel and/or sub-pixel may include a pixel display area at which light is emitted and a pixel non-display area at which light is not emitted. In an embodiment, the OLDE 28 may be disposed in the pixel display area, while other elements of the emission portion D may be disposed at the pixel non-display area.

In addition, the thin film encapsulation layer E may include a plurality of inorganic layers, or inorganic layers and organic layers. The thin film encapsulation layer E may be provided commonly across the unit pixels and/or the sub-pixels.

The organic layer of the thin film encapsulation layer E includes a polymer and may be a single layer or a layer stack formed of any one of polyethylene terephthalate, polyimide, polycarbonate, epoxy, polyethylene and polyacrylate. The organic layer may include polyacrylate, and in detail, may include a polymerized monomer composition including diacrylate-based monomer and triacrylate-based monomer. The monomer composition may further include monoacrylate-based monomer. Also, the monomer composition may further include a photoinitiator such as diphenyl(2,3,6-trimethylbenzoyl) phosphine oxide ("TPO"), but one or more embodiments are not limited thereto.

The inorganic layer of the thin film encapsulation layer E may be a single layer or a layer stack including a metal oxide or a metal nitride. In detail, the inorganic layer may include any one of SiNx, $Al_2O_3$, $SiO_2$ and $TiO_2$.

The top or uppermost layer of the thin film encapsulation layer E that is exposed to outside the display apparatus 20 may include the inorganic layer in order to reduce or effectively prevent intrusion of moisture into the OLED 28 or other layers of the emission portion D.

The thin film encapsulation layer E may include at least one sandwich or stacked structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer sequentially from the top portion of the OLED 28.

In another example, the thin film encapsulation layer E may include a first inorganic layer, a first organic layer, a second inorganic layer, a second organic layer, and a third inorganic layer sequentially from the top portion of the OLED 28.

In another example, the thin film encapsulation layer E may include a first inorganic layer, a first organic layer, a second inorganic layer, a second organic layer, a third inorganic layer, a third organic layer, and a fourth inorganic layer sequentially from the top portion of the OLED 28.

A halogenized metal layer including lithium fluoride (LiF) may be additionally included between the OLED 28 and the first inorganic layer of the thin film encapsulation layer E. The halogenized metal layer may reduce or effectively prevent damage to the OLED 28 in an embodiment of a method of manufacturing the display apparatus 20 when the first inorganic layer is formed in a sputtering method.

In a cross-sectional (thickness) direction of the display apparatus 20, the first organic layer may be thinner than the second inorganic layer, and the second organic layer may be thinner than the third inorganic layer.

Therefore, the display apparatus 20 may include the intermediate layer 28-2 for which an accurate pattern thereof is formed. As such, the intermediate layer 28-2 may be arranged at a precise location within the emission portion D so as to accurately implement images at the display area of the unit pixel. In addition, even if the intermediate layer 28-2 is repeatedly arranged along the substrate 21, patterns may be consistently implemented at the desired effective regions of the substrate 21 to have a constant or uniform distance therebetween, and thus, the display apparatus 20 may exhibit uniform quality during a continuous manufacturing processes.

In an embodiment, the intermediate layer 28-2 may be manufactured as a thin film by the deposition mask 120 and the deposition apparatus 100 system which employs the deposition mask 120 as described above.

FIGS. 7 to 11 are top plan views showing modified embodiments of the deposition mask 120 of FIG. 1.

Figure 7:
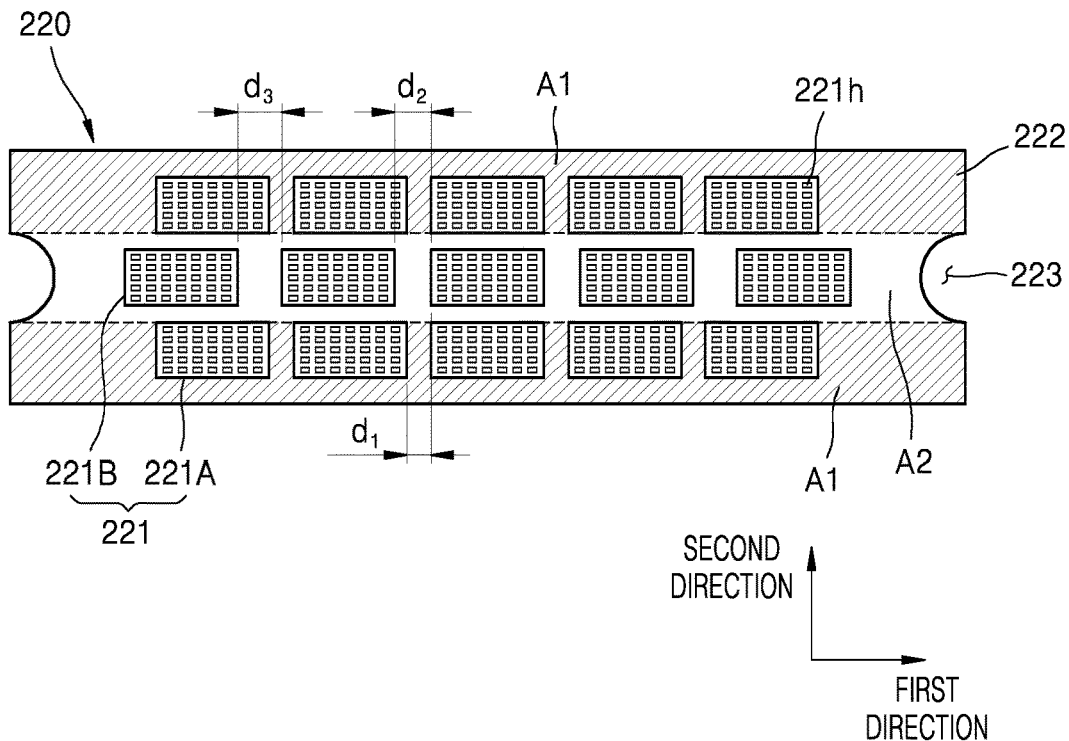
FIGS. 7 to 11 are top plan views showing modified embodiments of the deposition mask of FIG. 1.

Referring to FIG. 7, a deposition mask 220 according to a modified embodiment may include the same elements as those of the deposition mask 120 illustrated with reference to FIGS. 1 to 3. That is, the deposition mask 220 includes a pattern portion 221 including a plurality of (deposition) pattern holes 221h through which a deposition material passes, a clamping portion 222 which is extended in the first direction while being clamped by a clamp during extension of the deposition mask 120, and a clamping recess 223 which is not extended while the clamping portion 222 is clamped by the clamp during extension of the deposition mask 120.

In addition, a plurality of the pattern portions 221 of the deposition mask 220 may be arranged in the first direction and the second direction that crosses the first direction, and may include a plurality of first pattern portions 221A overlapping with the clamping portion 222 in the first direction and a plurality of second pattern portions 221B overlapping with the clamping recess 223 in the first direction. In addition, in an initial (un-extended) state of the deposition mask 120, a first distance d1 between two adjacent first pattern portions 221A may be smaller than each of second distances between two adjacent second pattern portions 221B. The first distances d1 within the first area A1 may be constant or equal to each other, and the second distances within the second area A2 may not be constant or equal to each other, but the invention is not limited thereto.

However, the deposition mask 220 of FIG. 7 is different from the deposition mask 120 of FIGS. 1 and 2 in that the second distances between two adjacent second pattern portions 221B gradually increase from a center portion of the deposition mask 120 to respective opposite ends thereof. That is, a second-second distance d3 between the second pattern portions 221B relatively close to an end may be greater than a first-second distance d2 between the second pattern portions 221B relatively close to the center portion of the deposition mask 220.

Referring to FIGS. 7 and 3, when the deposition mask 220 having the above structure is extended while being clamped by the clamp, the first pattern portions 221A and the second pattern portions 221B may be arranged in parallel with each other in both the first and second directions as in the deposition mask 120 of FIG. 3 by adjusting the tensile strength. That is, extended positions of the first pattern portions 221A define first distances therebetween (see d1' of FIG. 3) which correspond to the initial second-second distance d3 and the initial first-second distance d2 respectively between the second pattern portions 221B, due to application of the tensile force which extends the deposition mask 120.

Figure 8:
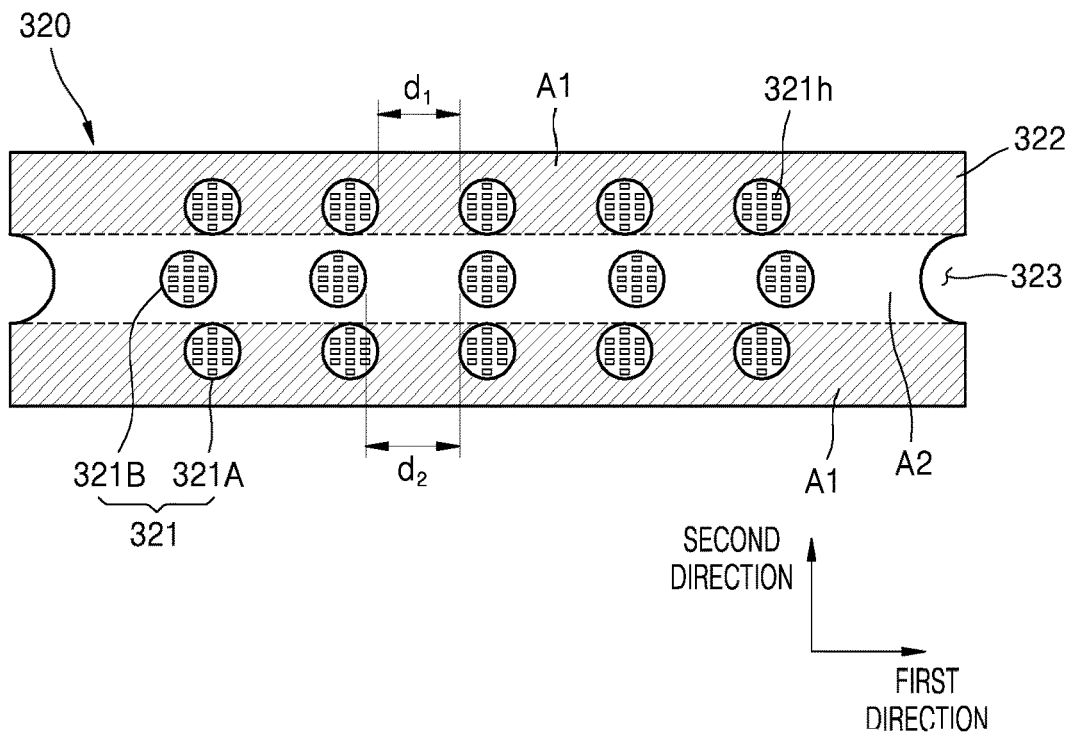
Figure 9:
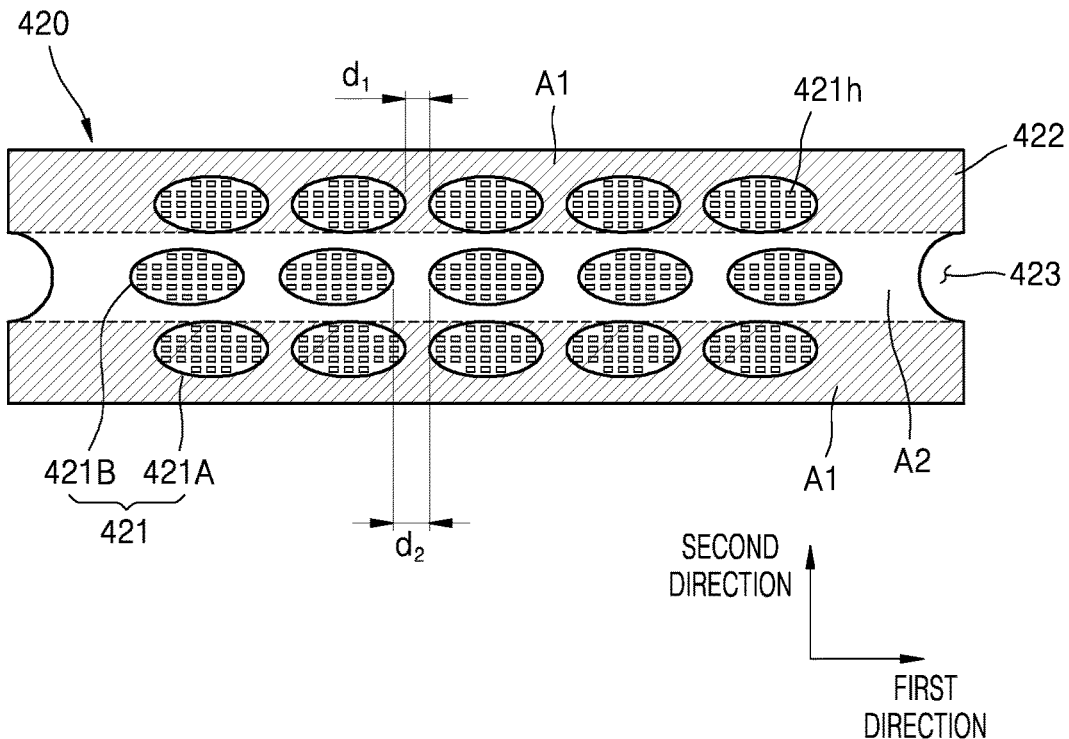
Figure 10:
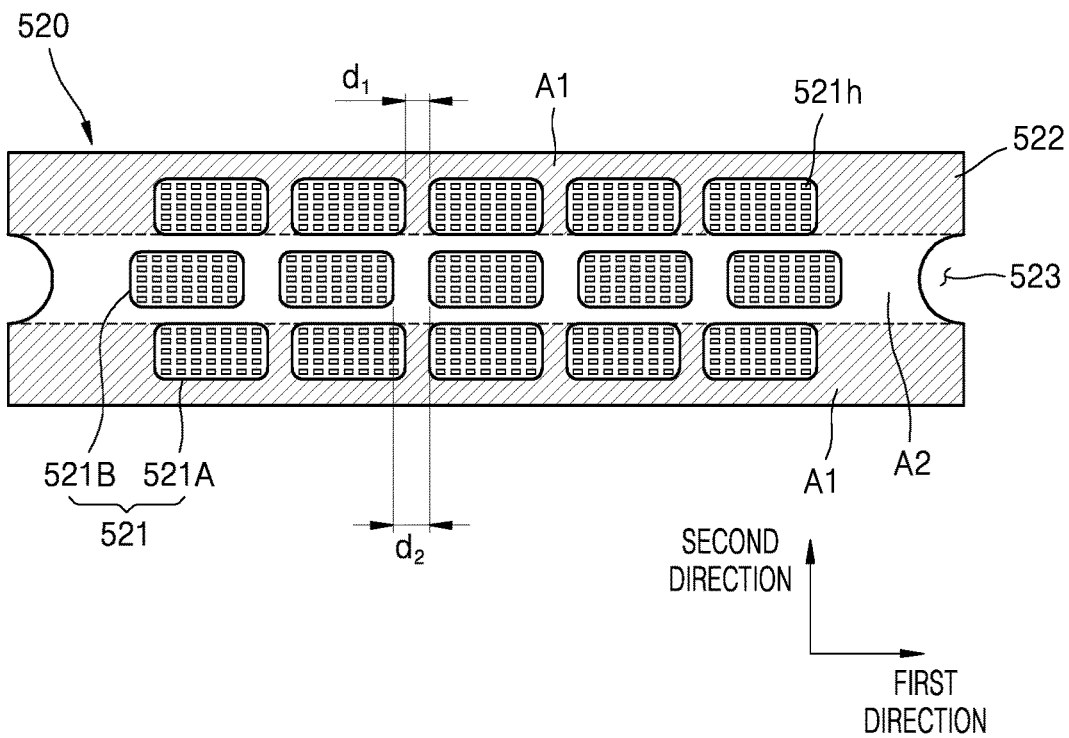

In addition, FIGS. 8 to 10 illustrate various modified embodiments of the pattern portion 121 illustrated in FIGS. 1 to 3.

FIG. 8 shows circular pattern portions 321, FIG. 9 shows oval pattern portions 421, and FIG. 10 shows rectangular pattern portions 521 having rounded corners. Referring respectively to FIGS. 8 to 10, the deposition mask 320, 420 and 520 includes the pattern portion 321, 421 and 521 through which a deposition material passes, a clamping portion 322, 422 and 522 which is extended in the first direction while being clamped by a clamp during extension of the deposition mask 320, 420 and 520, and a clamping recess 323, 423 and 523 which is not extended while the clamping portion 322, 422 and 522 is clamped by the clamp during extension of the deposition mask 320, 420 and 520.

As illustrated with reference to FIGS. 8 to 10, the pattern portions 321, 421 and 521 may have various planar shapes. However, in any case, deposition pattern holes 321h, 421h and 521h arranged within the planar area of the variously-shaped pattern portions 321, 421 and 521 may have the same planar shape, for example, rectilinear or square shapes, but are not limited thereto.

In addition, even when the pattern portions 321, 421 and 521 have various planar shapes, the first distance d1 between adjacent first pattern portions 321A, 421A and 521A may be smaller than the first-second distance d2 between adjacent second pattern portions 321B, 421B and 521B. In addition, although not shown in the drawings, second distances between adjacent second pattern portions 321B, 421B and 521B of the pattern portions 321, 421 and 521 shown in FIGS. 8 to 10 may gradually increase from a center portion of deposition mask 320, 420 and 520 towards the opposite ends as shown in FIG. 7.

Figure 11:
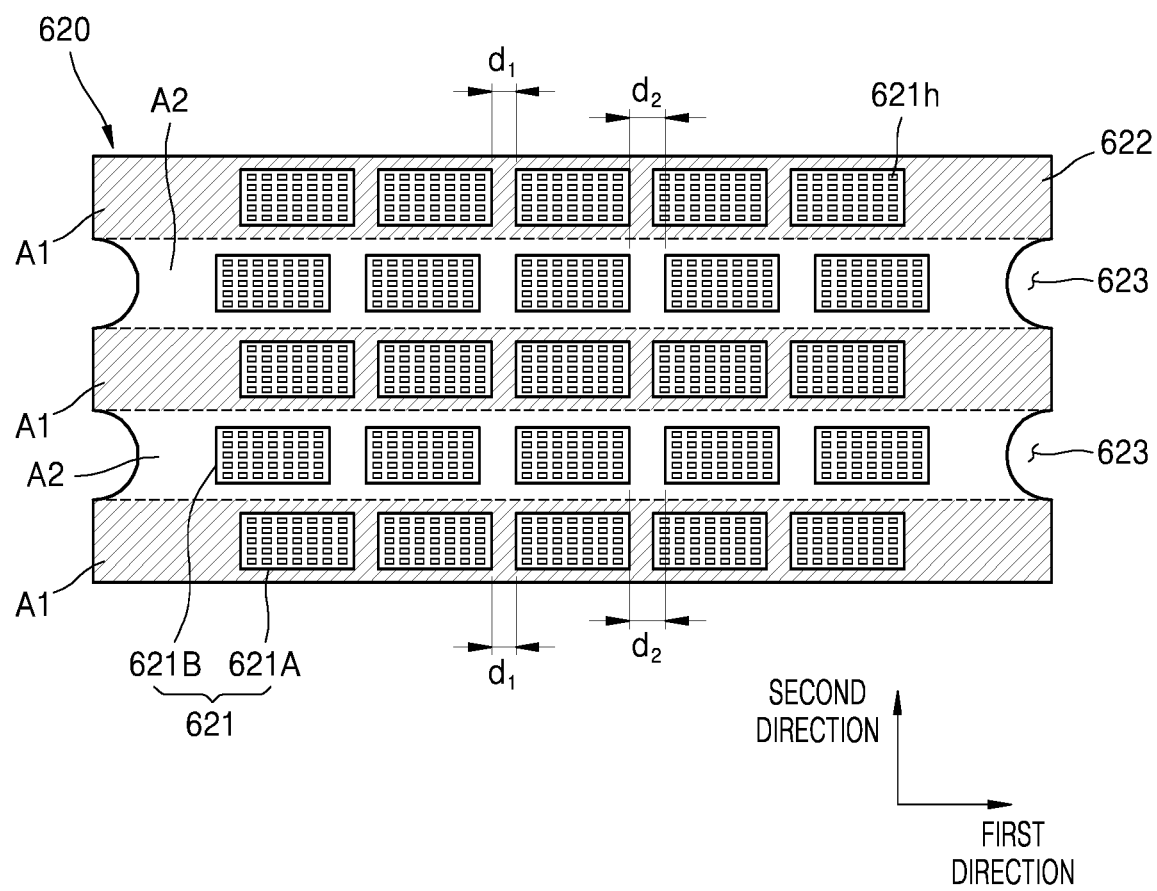

In addition, FIG. 11 illustrates another modified embodiment of a deposition mask 620 having a clamping portion 622 provided at opposite ends thereof for three regions thereof arranged in the width direction of the deposition mask 620.

Referring to FIG. 11, the deposition mask 620 may include the same elements as those of the deposition mask 120 illustrated with reference to FIGS. 1 to 3. That is, the deposition mask 620 includes a pattern portion 621 including a plurality of pattern holes 621h through which a deposition material passes, the clamping portions 622 each extended in the first direction while being clamped by a clamp during extension of the deposition mask 620, and a clamping recess 623 which is not extended while the clamping portions 622 are clamped by the clamp during extension of the deposition mask 620.

In addition, a plurality of the pattern portions 621 of the deposition mask 620 may be arranged in the first direction and the second direction that crosses the first direction, and may include a plurality of first pattern portions 621A overlapping with the clamping portions 622 in the first direction and a plurality of second pattern portions 621B overlapping with the clamping recess 623 in the first direction. In addition, in an initial (un-extended) state of the deposition mask 620, a first distance d1 between two adjacent first pattern portions 621A may be smaller than a second direction d2 between two adjacent second pattern portion 621B.

However, the deposition mask 620 of FIG. 11 may include three first areas A1 overlapping (e.g., disposed in a line) with the clamping portions 622 in the first direction, and two second areas A2 that are not clamped by the clamp during extension of the deposition mask 620 and may be arranged among the three first areas A1 in the second (width) direction of the deposition mask 620.

That is, the deposition mask 620 of FIG. 11 may include five pattern portions 621 in the first direction and five pattern portions 621 in the second direction, that is, twenty-five pattern portions 621 total. However, one or more embodiments are not limited to the above number of pattern portions 621. The number of the pattern portions 621 of FIG. 11 is an example for convenience of description. That is, one single deposition mask 620 may include the pattern portions 621 in a plurality of columns along the first and/or second directions.

Since the clamping portions 622 of the extended deposition mask 620 are bonded to the frame 110 (see FIG. 4) while being extended in the first direction, the pattern portions 621 may be regularly arranged in parallel with one another as in the deposition mask 120 of FIG. 3. That is, extended positions of the first pattern portions 621A define first distances therebetween (see d1' of FIG. 3) which correspond to the initial second distances (d2 in FIG. 11) between the second pattern portions 621B, due to application of the tensile force which extends the deposition mask 620.

Moreover, one single deposition mask 620 of FIG. 11 includes the plurality of pattern portions 621, and thus, the total number of deposition masks 620 necessary for manufacturing the mask frame assembly MF (see FIG. 4) may be greatly reduced. Accordingly, a time duration taken to manufacture the deposition mask 620 may be reduced.

In one or more embodiment, for example, a deposition mask includes a plurality of pattern portions in order to deposit a deposition material at multiple effective areas on the substrate S (see FIG. 4). Since the deposition mask 120 or 620 shown in FIGS. 1 to 3 or FIG. 11 includes the pattern portions in a plurality of columns in one deposition mask 120 or 620, the total number of deposition masks 120 or 620 which are extended by the clamping portion thereof 122 or 622 in the first direction and being bonded to the frame 110 is decreased. Thus, a time duration taken to manufacture the deposition mask 120 or 620 may be reduced.

According to one or more embodiment of the deposition mask, and a deposition apparatus and method of manufacturing a display apparatus use the same, even when the clamping portion of the deposition mask is extended when the frame and the extended deposition mask are bonded to each other, misalignment of the pattern portions of the extended mask with the effective regions of the target substrate may not occur.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a target substrate comprising a layer of a deposition material provided through a deposition mask,
wherein
the deposition mask is extendible in a length direction of the deposition mask, the deposition mask comprising:
a clamping portion which is at opposite ends of the deposition mask along the length direction, the clamping portion being configured to receive a force in a tensile direction along the length direction,
a pattern portion comprising a plurality of deposition pattern holes through which the deposition material passes to the target substrate,
the pattern portion provided in plural comprising:
first pattern portions arranged along the length direction and aligned with the clamping portion along the length direction, and
second pattern portions arranged along the length direction and adjacent to the first pattern portions in a width direction of the deposition mask which crosses the length direction,
a first area extended along the length direction between the opposite ends, the first area defining the clamping portion and including each of the first pattern portions, and
a second area extended along the length direction between the opposite ends, the second area including each of the second pattern portions,
when the force is not applied to the clamping portion, the deposition mask is not extended in the length direction thereof and includes:
non-extended positions of the first and second pattern portions which are respectively defined by positions of the first and second pattern portions when the force is not applied to the clamping portion, and
for the non-extended positions of the first and second pattern portions, a first distance along the length direction between adjacent first pattern portions which is less than a second distance along the length direction between adjacent second pattern portions,
a plurality of first distances is respectively defined between the adjacent first pattern portions and a plurality of second distances is respectively defined between the adjacent second pattern portions, and for the non-extended positions of the first pattern portions and the second pattern portions, the first distances and the second distances are respectively constant, and
when the force is applied to the opposite ends of the clamping portion in the tensile direction along the length direction, the deposition mask which is extended in the length direction thereof further includes the first distance between the adjacent first pattern portions being equal to the second distance between adjacent second pattern portions.

2. The display apparatus of claim 1, wherein each of the first pattern portions and the second pattern portions has a planar shape including one of a square shape, a circular shape, and an oval shape.

3. The display apparatus of claim 2, wherein each of the first pattern portions and the second pattern portions has the square shape and includes rounded corners.

4. The display apparatus of claim 1, wherein
for the non-extended positions of the second pattern portions, the second distances increase from a center portion of the deposition mask and respectively towards each of the opposite ends of the deposition mask.

5. The display apparatus of claim 1, wherein when the force is applied to the clamping portion:
the first distance between the adjacent first pattern portions is changed, and
the second distance between the adjacent second pattern portions is maintained.

* * * * *